United States Patent [19]
Ohuchi

[11] Patent Number: 5,998,877
[45] Date of Patent: *Dec. 7, 1999

[54] SEMICONDUCTOR DEVICE PACKAGED IN PLASTIC AND MOLD EMPLOYABLE FOR PRODUCTION THEREOF

[75] Inventor: Shinji Ohuchi, Tokyo, Japan

[73] Assignee: Oki Electric Industry Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/916,252

[22] Filed: Aug. 22, 1997

[30] Foreign Application Priority Data

Aug. 29, 1996 [JP] Japan ................................ 8-227280

[51] Int. Cl.⁶ .......................... B29C 45/26; H01L 21/56; H01L 23/495
[52] U.S. Cl. ........................ 257/787; 257/666; 257/673; 257/693; 257/698; 257/788; 257/789
[58] Field of Search ............................... 257/666, 791, 257/692, 693–698, 778, 676, 777, 792–795, 787, 788, 789, 798, 673, 723, 730

[56] References Cited

U.S. PATENT DOCUMENTS

| | | | |
|---|---|---|---|
| 4,495,376 | 1/1985 | Hightower et al. | 257/696 |
| 4,697,204 | 9/1987 | Mita et al. | 257/778 |
| 4,724,280 | 2/1988 | Tsuji et al. | 257/696 |
| 5,087,963 | 2/1992 | Kaneda et al. | 257/794 |
| 5,428,248 | 6/1995 | Cha | 257/787 |
| 5,471,097 | 11/1995 | Shibata | 257/787 |
| 5,519,251 | 5/1996 | Sato et al. | 257/778 |
| 5,583,375 | 12/1996 | Tsubosaki | 257/787 |
| 5,684,330 | 11/1997 | Lee | 257/778 |
| 5,703,407 | 12/1997 | Hori | 257/783 |
| 5,723,901 | 3/1998 | Katsumata | 257/693 |
| 5,760,471 | 6/1998 | Fujisawa | 257/692 |
| 5,801,439 | 9/1998 | Fujisawa et al. | 257/773 |
| 5,821,606 | 10/1998 | Murakami et al. | 257/659 |
| 5,821,615 | 10/1998 | Lee | 257/723 |
| 5,834,830 | 11/1998 | Cho | 257/667 |
| 5,898,212 | 4/1999 | Kim | 257/666 |

FOREIGN PATENT DOCUMENTS

| | | | |
|---|---|---|---|
| 5-206350 | 8/1993 | Japan | 257/666 |
| 6-29429 | 2/1994 | Japan | 257/666 |
| 6-132453 | 5/1994 | Japan | 257/693 |

*Primary Examiner*—Alexander O. Williams
*Attorney, Agent, or Firm*—Jones Volentine, LLP

[57] ABSTRACT

A semiconductor device packaged in a plastic package wherein the thickness of the plastic mold on the top surface of the semiconductor device chip is less than the height of the lead on the top surface of the semiconductor device chip and the top surface to the plastic mold filling the space between the leads is convex downward in an arc shape, and a metal mold employable for producing the semiconductor device packaged in a plastic package comprising a lower mold having a cavity in which a semiconductor device chip provided with a plurality of leads thereon, is placed during a molding process, and an upper mold having a lower surface having a plurality of longitudinal projections and recesses arranged in parallel to one anther, the cross section of the longitudinal projections and recesses produced along the lower surface of the upper mold being effective to cause longitudinal linear contact along the longitudinal projections and recesses, between the lower surface and the edges of the leads, during a molding process.

20 Claims, 5 Drawing Sheets

SEMICONDUCTOR DEVICE PACKAGED IN PLASTIC AND MOLD EMPLOYABLE FOR PRODUCTION THEREOF

FIELD OF THE INVENTION

This invention relates to an improvement applicable to a semiconductor device packaged in a plastic package and to a metal mold employable for producing the semiconductor device packaged in a plastic package. More specifically, this invention relates to an improvement applicable to a small outline nonlead package, the improvement being effective to enhance the reliability of a semiconductor device packaged in a plastic package, the advantage being realized be preventing the surface discharge from occurring between leads of the semiconductor device packaged in a plastic package and by preventing a burr of a resin or a plastic material from being produced on the edge of a lead during the molding process for producing a semiconductor device packaged in a plastic package.

BACKGROUND OF THE INVENTION

The package of a semiconductor device is classified into two, including a ceramic package and a plastic package. The former has a large magnitude of reliability and the latter has an advantage in the economic aspects. Insofar as semiconductor devices employed for an IC, a memory card or the like are concerned, a plastic package is predominantly employed, because the plastic package can be thin and small in size, in addition to that the cost thereof is fairly less expensive.

Referring to FIGS. 1 through 5, the structure of an example of a small outline nonlead package available in the prior art and drawbacks involved with the structure will be briefed below.

Referring to FIGS. 1 through 3, each of leads 5 arranged in parallel to one another on the top surface of a semiconductor device chip 3 are bonded with each of pads 4 employing an Au wire 7. The semiconductor device chip 3 is molded with a resin, or a plastic material. As a result, the top and side surfaces of the semiconductor device chip 3 is covered by a resin mold 9. Since the external ends of the leads 5 are designed not to extend beyond the side surface of the molded resin 9, as is illustrated in FIGS. 1 and 2 and since the bottom surface of the semiconductor device chip 3 is not covered by the resin mold 9, the semiconductor device packaged in the foregoing small outline nonlead package available in the prior art has an advantage that the horizontal area is small and the thickness is thin.

Referring to FIGS.2 and 3, the top surface 5a of the lead 5 is flush with the top surface 9a of the resin mold 9. This caused three drawbacks for a semiconductor device packaged in the small outline nonlead package available in the prior art. The first drawback is a rather short insulation distance between the leads 5, causing rather large possibilities in which the neighboring leads 5 are short circuited. It is noted is that a straight line connecting two points represents the shortest distance between the two points. The second drawback is a tendency in which neighboring two leads 5 are readily short circuited by foreign materials 13 laid on the top surface 9a of the resin mold 9 in a manner to bridge the neighboring two leads 5, causing large possibilities in which the neighboring leads 5 are short circuited, as is illustrated in FIG. 4 which illustrates a side view of a semiconductor device packaged in a plastic package available in the prior art which is mounted on a printed board 11 in a face down position. The third drawback is a tendency in which a resin flows along the top surface 5a of the lead 5 to produce a burr 15 of the resin illustrated in FIG. 5, during a molding process. In the drawing, the reference numeral 9 indicates shows a resin mold. The resin burr 15 readily causes less conductivity for the leads 5 or large possibility in which the surface conductivity is reduced by the resin burr 15 spreading on the top surface 5a of the lead 5.

OBJECTS AND SUMMARY OF THE INVENTION

An object of this invention is to provide a semiconductor device packaged in a plastic package, wherein insulation between the neighboring leads is improved, possibility of a foreign material accidentally laid between the neighboring leads causes some adverse results is made less, and possibility to produce a resin burr on the top surface of a lead is made less.

Another object of this invention is to provide a metal mold employable for producing a semiconductor device packaged in a plastic package, wherein at least one of insulation between the neighboring leads is improved, possibility of a foreign material accidentally laid between the neighboring leads causes some adverse results is made less, and possibility to produce a resin burr on the top surface of a lead is made less.

To achieve at least one of the foregoing objects and other objects of this invention, a semiconductor device packaged in a plastic package in accordance with this invention includes:

a semiconductor device chip, a plurality of leads each of which is bonded with reach of pads of the semiconductor device chip and arranged on the top surface of the semiconductor device chip in parallel to one another to extend towards the both opposite directions, extension of the ends of the leads beyond the edge of the semiconductor device chip being limited to a small length, and a resin mold covering the top and side surfaces of the semiconductor device chip, wherein the thickness of the resin mold on the top surface of the semiconductor device chip is less than the height of the lead on the top surface of the semiconductor device chip and the top surface of the resin mold filling the space between the leads is convex downward in an arc shape.

In the foregoing semiconductor device packaged in a plastic package in accordance with this invention, the plastic package can be a small outline nonlead package.

To achieve the foregoing other object of this invention, a metal mold comprising:

a lower mold having a cavity in which a semiconductor device chip provided with a plurality of leads thereon arranged in parallel to one another to extend towards the both opposite directions, is placed during a molding process, and an upper mold having a lower surface having a plurality of longitudinal projections and recesses arranged in parallel to one anther, the cross section of the longitudinal projections and recesses has a wavy shape, resultantly the shape of the longitudinal projections and recesses produced along the lower surface of the upper mold being effective to cause longitudinal linear contact along the longitudinal projections and recesses, between the lower surface and the edges of the leads, during a molding process.

BRIEF DESCRIPTION OF THE DRAWINGS

This invention, together with its various features and advantages, can be readily understood from the following more detailed description presented in conjunction with the following drawings, in which.

DETAILED DESCRIPTION OF THE PREFERRED EMBODIMENTS

Referring to drawings, a detailed description will be presented below for a semiconductor device packaged in a plastic package in accordance with one embodiment of this invention and a metal mold employable for producing a semiconductor device packaged in a plastic package in accordance with one embodiment of this invention.

Figure 6:
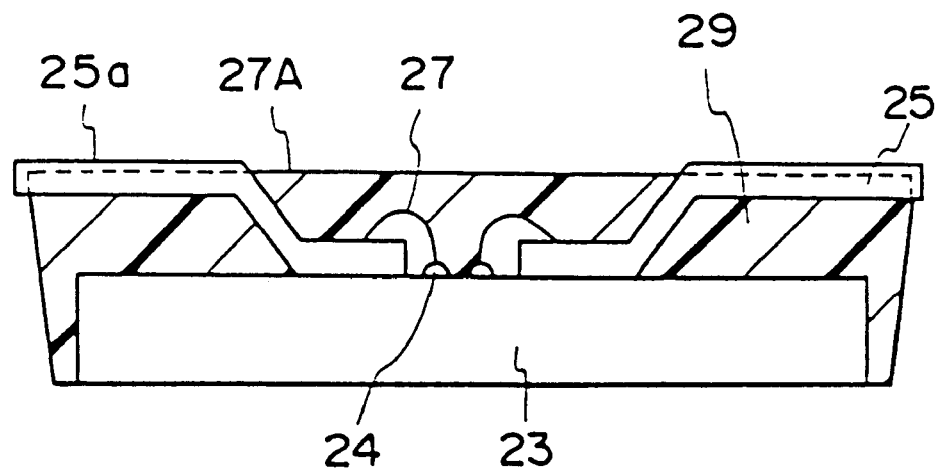
FIG. 6 is a cross section of a semiconductor device packaged in a small outline nonlead package in accordance with an embodiment of this invention.

Referring to FIG. 6, each lead 25 is arranged on the top surface of a semiconductor device chip 23 in parallel to one another. Each of the leads 25 is bonded with each of contact pads 24 employing an Au wire 27. The semiconductor device chip 23 is molded with a resin, and the top and side surfaces of the semiconductor device chip 23 are covered by a resin mold 29. It is important that the horizontal area of the resin mold 29 is not so much larger than that of the semiconductor device chip 23 and that the ends of the leads 25 do not exceed so much the side surface of the resin mold 29. It is effective to reduce the horizontal dimension and the thickness of the finished semiconductor device packaged in a plastic mold.

It is noted that the height of the top surface 29a of the resin mold 29 is lower than the top surface 25a of the leads 25.

Figure 7:
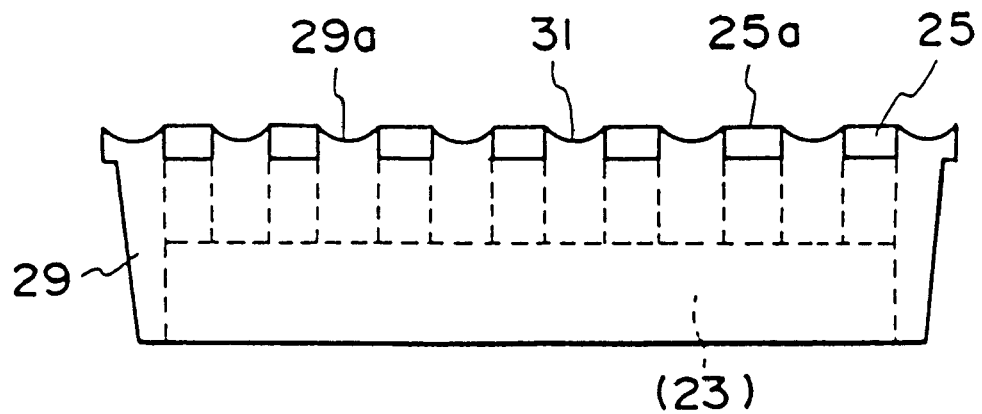
FIG. 7 is a side view of a semiconductor device packaged in a small outline nonlead package in accordance with an embodiment of this invention, observing FIG. 6 in the direction form side to side.

Referring to FIG. 7, the top surface 29a of the resin mold 29 in the region between the leads 25 is convex downward to make a longitudinal recess 31 extending along the leads 25. The depth of the longitudinal recess 31 is approximately a half of the height of the leads 25. The shape of the surface 29a of the resin mold 29 in the longitudinal recess 31 is preferably an arc or a part of a circle. Alternatively, the shape of the surface 29a of the resin mold 29 in the longitudinal recess 31 can be a V-shape. The top surfaces 25a of the leads 25 are flush with each other, allowing the longitudinal recess 31 to intervene therebetween.

As was described above, the longitudinal recesses 31 having an arc shaped cross section intervene between the leads 25 of the semiconductor device of this invention. This is effective to make the distance between the leads 25 along the surface 29a of the resin mold 29, longer than that of the semiconductor device available in the prior art in which the surface of the resin mold is flush with the surface of a lead. In other words, the insulation distance along the surface 29a between the leads 25 is longer for the semiconductor device of this invention than for the semiconductor device available in the prior art.

Further, the surface 29a of the resin mold 29 of the semiconductor device of this invention is remote from the surface 25a of the lead 25 of the semiconductor device of this invention. In this sense, a larger insulation space is secured between the leads 25.

As a result, a leak current is effectively prevented from occurring between the leads 25, even a foreign material is accidentally laid between the leads 25 during a process in which the semiconductor device is mounted or after the semiconductor device is mounted.

Figure 1:
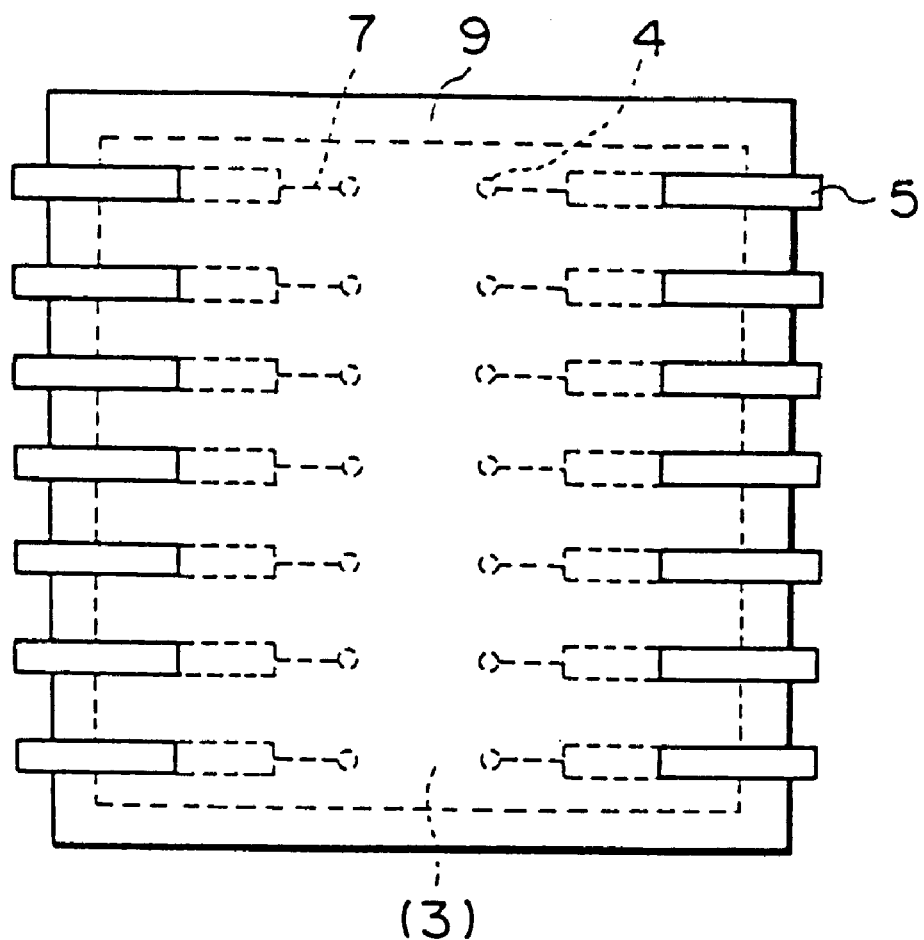
FIG. 1 is a plan view of a semiconductor device packaged in a small outline nonlead package available in the prior art.
Figure 2:
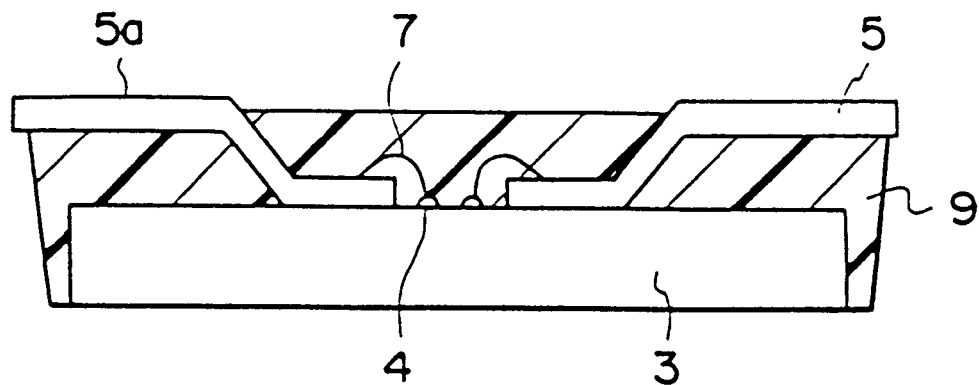
FIG. 2 is a cross section of a semiconductor device packaged in a small outline nonlead package available in the prior art, observing FIG. 1 in the direction from the bottom to the top of the drawing.
Figure 3:
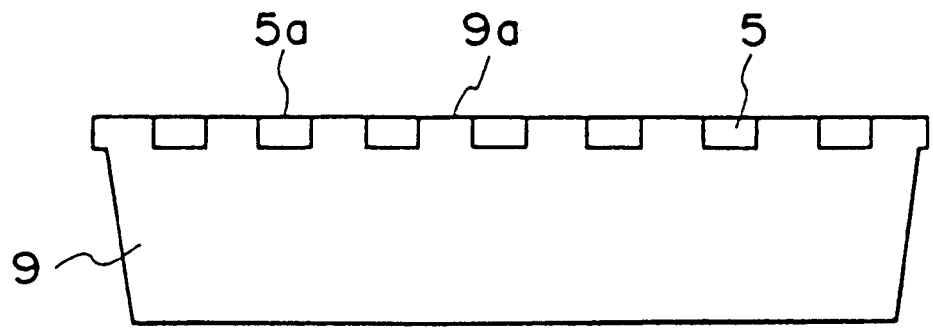
FIG. 3 is a side view of a semiconductor device packaged in a small outline nonlead package available in the prior art, observing FIG. 1 in the direction from side to side of the drawing.
Figure 4:
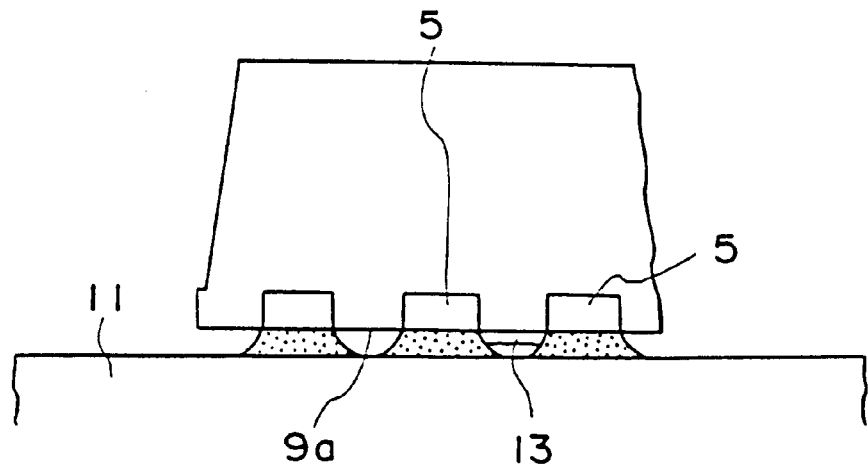
FIG. 4 is an enlarged side view of a semiconductor device packaged in a small outline nonlead package available in the prior art, specifically showing a foreign material bridging the leads.
Figure 5:
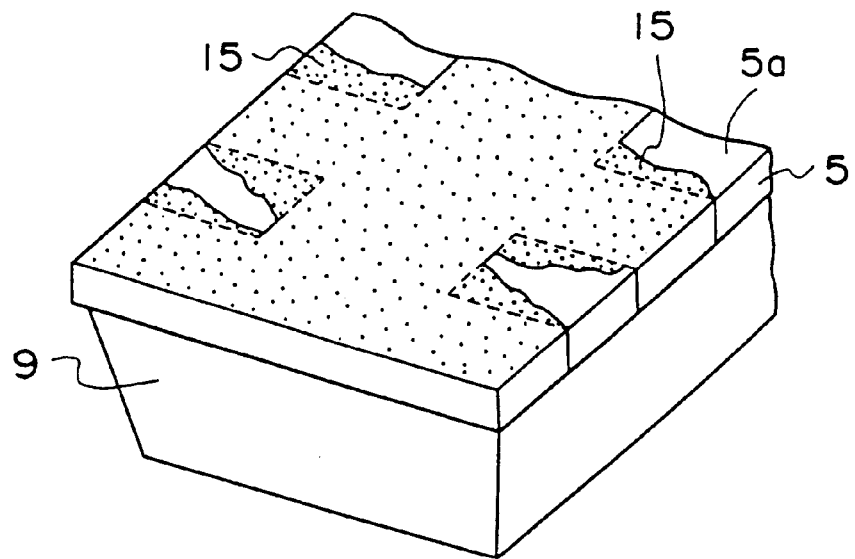
FIG. 5 is a schematic perspective view of a semiconductor device packaged in a small outline nonlead package available in the prior art, specifically showing resin burrs extending on the leads.

The longitudinal recess 31 produced between the leads 25 causes the surface 29a of the resin mold 29 to be non-flat, resultantly preventing resin burrs 15 (See FIG. 5.) from being produced on the surface 25a of the lead 25. This is effective to secure the surface conductivity of leads 25.

Figure 8:
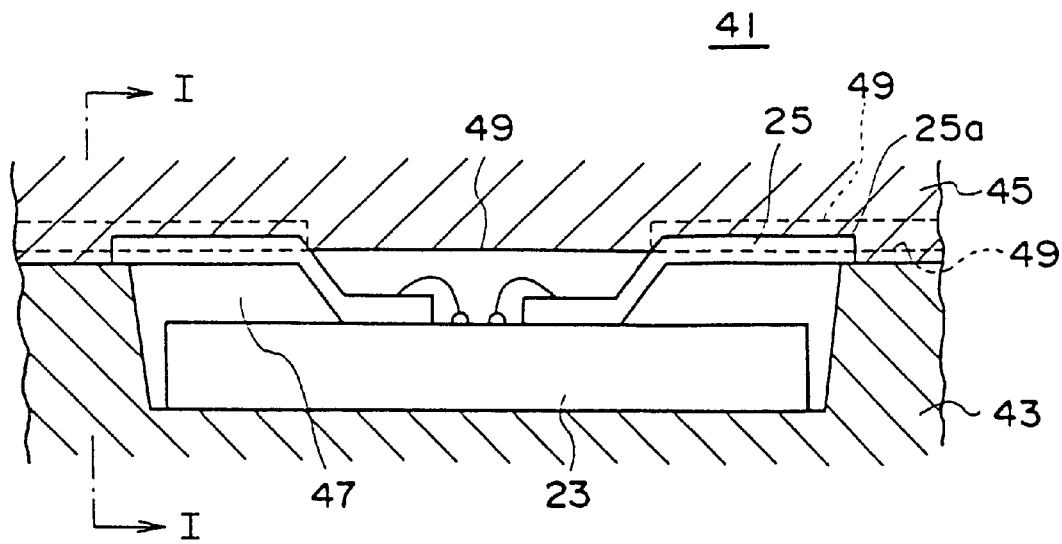
FIG. 8 is a cross section of a metal mold in accordance with an embodiment of this invention.
Figure 9:
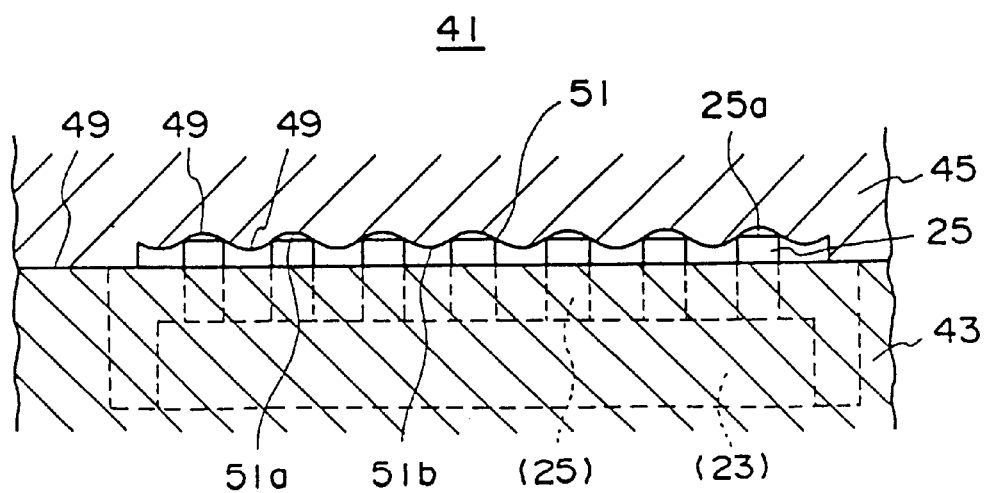
FIG. 9 is a cross section of a metal mold in accordance with an embodiment of this invention, observing FIG. 8 in the direction from side to side.

Referring to FIGS. 8 and 9, the structure of a pair of metal molds 41 and a process for producing a semiconductor device packaged in a plastic package in accordance with this invention will be described below. FIG. 8 is a cross section of a pair of metal molds 41 in accordance with this invention and FIG. 9 is a cross section of the same, observing FIG. 8 in the direction shown by C—C therein. The pair of metal molds 41 consists of an upper mold 45 and a lower mold 43. The lower mold 43 has a cavity 47 in which a semiconductor device chip 23 provided plural leads 25 is placed during a period in which a molding process is conducted, to be molded by a thermosetting resin. The semiconductor device chip 23 is placed in the cavity 47 in the upright position.

Referring to FIGS. 8 and 9, the lower surface 49 of the upper metal mold 45 has a plurality of longitudinal projections and recesses 51 arranged in parallel to one another having a cross section of a wavy shape. The wavy shape is preferably a continuation of portions of a circle.

When a molding process is conducted, the semiconductor device chip 23 is placed in a manner that each of recesses 51a of the longitudinal projections and recesses 51 face each of the leads 25 and each of projections 51b of the longitudinal projections and recesses 51 face each of the space between the leads 25. Since the lower surface 49 of the upper mold 45 and the edges of the leads 25 contact in a longitudinal linear contact, a resin can not enter into spaces corresponding to the recesses 51a, while spaces between the leads 25 are filled by the resin, and the top surfaces 29a (See FIG. 7.) of the resin mold 29 (See FIG. 7.) filling the spaces between the leads 25 become convex downward in an arc shape (See FIG. 7.).

In this manner, a semiconductor device packaged in a plastic package wherein the thickness of the resin mold on the top surface of the semiconductor device chip is less than the height of the lead on the top surface of the semiconductor device chip and the top surface of the resin mold filling the space between the leads is convex downward in an arc shape can readily be produced by employing the foregoing metal mold.

The forgoing description has clarified that this invention has successfully provided a semiconductor device packaged in a plastic package, wherein insulation between the neighboring leads is improved, possibility of a foreign material accidentally laid between the neighboring leads causes some adverse results is made less, and possibility to produce a resin burr on the top surface of a lead is made less and a metal mold employable for producing a semiconductor device packaged in a plastic package, wherein insulation between the neighboring leads is improved, possibility of a foreign material accidentally laid between the neighboring leads causes some adverse results is made less, and possibility to produce a resin burr on the top surface of a lead is made less.

Although this invention has been described with reference to specific embodiments, this description is not meant to be construed in a limiting sense. Various modifications of the disclosed embodiments, as well as other embodiments of this invention will be apparent to persons skilled in the art upon reference to the description of this invention. It is therefore contemplated that the appended claims will cover any such modifications or embodiments as fall within the true scope of this invention.

What is claimed is:

1. A semiconductor device comprising:

a semiconductor chip with a principal surface having a plurality of contact pads;

a plurality of leads spaced apart from each other, each lead including a first segment in contact with the principal surface at a lead portion of the principal surface and electrically connected to a respective one of the plurality of contact pads, a second segment connected to the first segment at one end and spaced apart from the principal surface at an opposite end, and a third segment connected to the opposite end and substantially parallel to the principal surface having an upper face facing away from the principal surface, the upper face being provided at an upper lead height above the principal surface; and plastic packaging material in contact with the leads and in contact with the principal surface only outside the lead portion thereof, the plastic packaging material having an upper surface at the upper lead height, the upper surface having gap portions between each pair of adjacent third segments, each gap portion having a non-flat shape and being recessed below the upper surface.

2. The semiconductor device of claim 1, wherein a length of the plurality of leads and an extent of the plastic packaging material relative to the chip qualify the semiconductor device as a small outline nonlead package.

3. The semiconductor device of claim 1, wherein the plastic packaging material is a resin.

4. The semiconductor device of claim 1, wherein said non-flat shape is arcuate.

5. The semiconductor device of claim 1, wherein said non-flat shape is a V-shape.

6. The semiconductor device of claim 1, wherein said non-flat shape is not flat throughout all of each gap portion.

7. A mold for forming a plastic body around a semiconductor chip for a semiconductor device, the mold comprising:

a lower mold having a cavity in a inside surface for holding a semiconductor chip; and an upper mold having a patterned surface including a plurality of projections having a non-flat shape in a cross-section thereof, wherein the projections are spaced apart a distance substantially equal to a cross sectional thickness of leads attached to the semiconductor chip, and wherein each of the plurality of projections longitudinally contacts each adjacent pair of the leads and extends downward between each adjacent pair of the leads when the chip is disposed in the cavity of the inside surface and the patterned surface of the upper mold is closed down on the lower mold.

8. The mold of claim 7, wherein at least one of the lower mold and the upper mold is formed of metal.

9. The mold of claim 7, wherein the patterned surface further includes a plurality of recessions spaced apart a distance substantially equal to a distance between adjacent leads.

10. The mold of claim 9, wherein the patterned surface has a wavy profile.

11. A semiconductor device comprising:

a semiconductor chip with a principal surface having a plurality of electrodes;

a plurality of leads, each having a first portion in contact with the principal surface and electrically connected to the electrodes, a second portion disposed a distance from the principal surface, and a third portion connected to the first portion and the second portion; and plastic packaging material packaging the principal surface, the first portion, the second portion, and the third portion, leaving part of the second portions of the leads exposed, the plastic packaging material having a top surface, recesses from the top surface of the plastic packaging material being formed in the plastic packaging material between adjacent pairs of second portions of the leads.

12. The semiconductor device of claim 11, wherein a length of the plurality of leads and an extent of the plastic packaging material relative to the chip qualify the semiconductor device as a small outline nonlead package.

13. The semiconductor device of claim 11, wherein the plastic packaging material is a resin.

14. The semiconductor device of claim 11, wherein said recesses have an arcuate shape.

15. The semiconductor device of claim 11, wherein said recesses have a V-shape.

16. The semiconductor device of claim 11, wherein said recesses are not flat throughout all of a gap between pairs of adjacent second portions.

17. The mold of claim 7, wherein said non-flat shape is arcuate.

18. The mold of claim 7, wherein said non-flat shape is V-shaped.

19. A semiconductor device comprising:

a semiconductor chip with a principal surface having a plurality of contact pads;

a plurality of leads spaced apart from each other, each lead including a first segment in contact with the principal surface at a lead portion of the principal surface and electrically connected to a respective one of the plurality of contact pads, a second segment connected to the first segment at one end and spaced apart from the principal surface at an opposite end, and a third segment connected to the opposite end and substantially parallel to the principal surface having an upper face facing away from the principal surface, the upper face being provided at an upper lead height above the principal surface; and plastic packaging material in contact with the leads and in contact with the principal surface only outside the lead portion thereof, the plastic packaging material having an upper surface, the upper surface having gap portions between each pair of adjacent third segments, each gap portion having a non-flat shape and being recessed below the upper surface.

20. A semiconductor device comprising:

a semiconductor chip with a principal surface having a plurality of electrodes;

a plurality of leads, each having a first portion in contact with the principal surface and electrically connected to the electrodes, a second portion disposed a distance from the principal surface, and a third portion connected to the first portion and the second portion; and plastic packaging material packaging the principal surface, the first portion, the second portion, and the third portion, leaving part of the second portions of the leads exposed, the plastic packaging material having an upper surface, recesses in the upper surface of the plastic packaging material being formed in the plastic packaging material between adjacent pairs of second portions of the leads.

* * * * *